Oct. 13, 1970 R. W. BROUNLEY 3,534,244

BROAD BAND MICROWAVE FREQUENCY MULTIPLIER

Filed June 11, 1969

INVENTOR
Richard W. Brounley
BY
Robert A. Buckles
ATTORNEY

United States Patent Office 3,534,244
Patented Oct. 13, 1970

3,534,244
BROAD BAND MICROWAVE FREQUENCY MULTIPLIER

Richard W. Brounley, St. Petersburg, Fla., assignor to Trak Microwave Corporation, Tampa, Fla.
Continuation-in-part of application Ser. No. 648,465, June 23, 1967. This application June 11, 1969, Ser. No. 832,392
Int. Cl. H02n 5/15
U.S. Cl. 321—69 3 Claims

ABSTRACT OF THE DISCLOSURE

A broad band microwave frequency multiplier having an input filter and impedance matching network coupled to a first non-linear capacitive element mounted on a first inductive post within a rectangular metallic cavity having a combine broad band pass filter section tuned to pass the fourth harmonics of the input frequency band. A second inductive post centrally disposed within the rectangular cavity serves as the output tuning element for the combline filter section and also as the input tuning element for an interdigital output filter mounted within the remaining portion of the rectangular cavity. A second non-linear capacitive element is mounted on the common central inductive post and is energized by the fourth harmonic signals passed by the combline filter section to produce third harmonics of that signal band. The interdigital filter section is tuned to pass these multiples, i.e., twelve times the input frequencies, over a bandwidth of twenty percent, and this broad band high frequency output is taken from a coaxial output terminal directly connected to an output inductive tuning post within the cavity.

REFERENCE TO RELATED APPLICATION

This application is a continuation-in-part of prior application Ser. No. 648,465 filed June 23, 1967, now abandoned by the same inventor and assigned to the same assignee. The entire disclosure of said prior application is incorporated herein by reference thereto.

BACKGROUND OF THE INVENTION

The problem to which the present invention is directed is that of producing high frequency microwave energy of a broad band characteristic, suitable for frequency modulation at video frequencies, or for electronic tuning over a broad band of high microwave frequency. A common answer to the increasing demand for ever higher frequency sources has been the use of harmonic generators as means for multiplying the frequency of signals from a fundamental microwave oscillator. One such harmonic generator is disclosed in U.S. Pat. No. 3,286,156 which issued on Nov. 15, 1966 to R. L. Barkes and is assigned to the assignee of the present application. This form of harmonic generator is admirably suited for use as a parametric amplifier pump, or as a local oscillator, whose frequency stability is important. However, such prior art multipliers do not readily lend themselves to electronic tuning or to broad band FM operation, because tuning means applied to the output reflect through the multiplier to affect the tuning of the fundamental input oscillator. The device of my invention provides an input LC filter section which is matched both by the driving source impedance at its input and by the varactor impedance at its output, coupled to a combline filter section which is matched both by the varactor impedance at its input and by a second varactor impedance at its output, while at the same time it appears as an open circuit to the output frequency. Combined with this, an output interdigital filter section is matched at its input by the second varactor impedance and at its output by the load, normally fifty ohms, and this section appears as an open circuit to the input frequency. This structure of the present invention achieves these objectives by completely passive means; requiring no tuning, no bias or other power, it efficiently multiplies the input radio frequency by twelve and delivers substantially constant power output at twelve times the input frequency over a band width of twenty percent of the output frequency.

Accordingly, it is an object of the invention to provide a broad band radio frequency multiplier, particularly for electromagnetic energy in the microwave spectrum.

Another object is to provide such a frequency multiplier which is completely passive in operation.

A more particular object is to provide a broad band radio frequency multiplier which is a matched impedance device over a bandwidth as high as twenty percent.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which.

DETAILED DESCRIPTION

Figure 1:
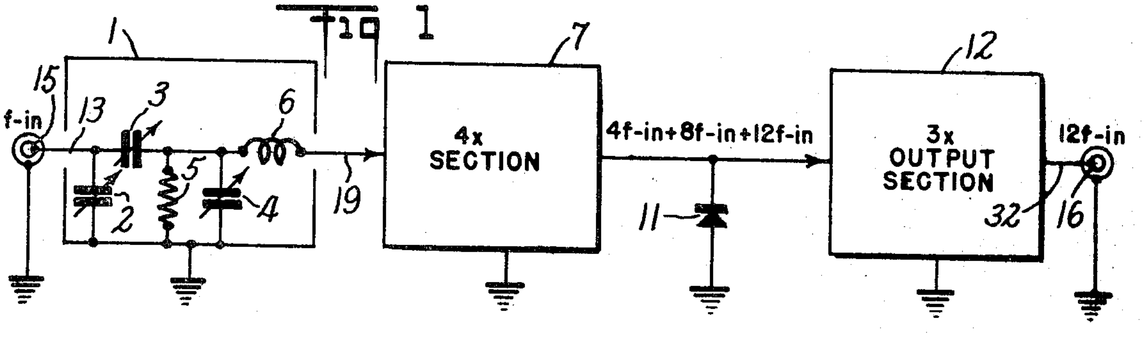
FIG. 1 is a schematic diagram of the electrical circuit of the invention.

Referring now in greater detail to the drawings, in FIG. 1 the box 1 represents an input band pass filter and impedance matching network comprising adjustable variable capacitors 2, 3 and 4, in combination with a fixed resistor 5 and inductance 6. The box 7 represents the schematically a 4$x$ multiplier section comprising a non-linear variable capacitance element (varactor) 8 (shown in FIG. 4) connected with a combline broad band filter 9 (FIG. 4), the output of which is connected to a second non-linear variable capacitance element (varactor) 11. The box 12 represents schematically a 3$x$ multiplier section comprising an interdigital output filter section (14 in FIG. 4) which is tuned to pass only the third harmonics of the parametric frequencies generated by varactor 11. Accordingly, the input frequencies *f-in* which are introduced into the device of the invention via the input coaxial connector 15 (FIGS. 1, 2 and 4), are multiplied twelve times and the band of output frequencies appearing at the output coaxial connector 16 (FIGS. 1, 2 and 4) are at twelve times the input frequencies, over a bandwidth of twenty percent.

In the preferred embodiment of the invention the combline filter 9 is tuned to the fourth harmonics of the input frequency band *f-in*, whereby it passes the fourth harmonics of the input frequencies, as generated by varactor 8, while effectively suppressing all other harmonics thereof. The varactor 11 is self-biased and energized by this fourth harmonic energy, causing it to produce even higher frequencies in the form of parametric harmonics, including 4*f-in* and 8*f-in* and 12*f-in*, etc. The box 12 represents schematically the output section of the device and includes an interdigital filter tuned to the third harmonic of the energy which it receives from varactor 11, thereby passing all of the harmonics corresponding to 12*f-in*, and effectively suppressing all other harmonics generated by varactor 11.

The varactor element 8, which is a relatively low impedance device having a nominal impedance of approximately 50 ohms, receives radio frequency energy from section 1, is self-biased thereby, and because of its non-linear characteristics converts this input signal energy into a multitude of parametric signals at multiple harmonics of the fundamental frequency, *f-in*. The band pass filter section 1 prevents the harmonic signals generated by varactor 8 from passing back to the input terminal 15 and thus prevents any detuning or other effect on the basic input frequency source.

Because the combline filter structure (9 of FIG. 4) of section 7 presents a high impedance to all frequencies other than the fundamental frequency to which it is tuned, none of the parametric harmonics generated by varactor 8 other than the fourth harmonic are passed. In like manner the interdigital output filter of section 12 (14 in FIG. 4) presents a high impedance to all frequencies other than the third harmonic of the mid band frequencies generated by varactor 11, so that these harmonics are the only signals which pass to the output terminal 16. Because the cavity of the output section 12 resonates at the harmonic F12 of the input frequency *f-in*, these signals are accentuated therein while all others are suppressed. However, because of the construction which I use, the selectivity of both the input and output sections is broad band in that transmission therethrough remains substantially flat and constant for a bandwidth of 20% of frequencies *f-in* and 12*f-in*.

Figures 2, 3, 4:
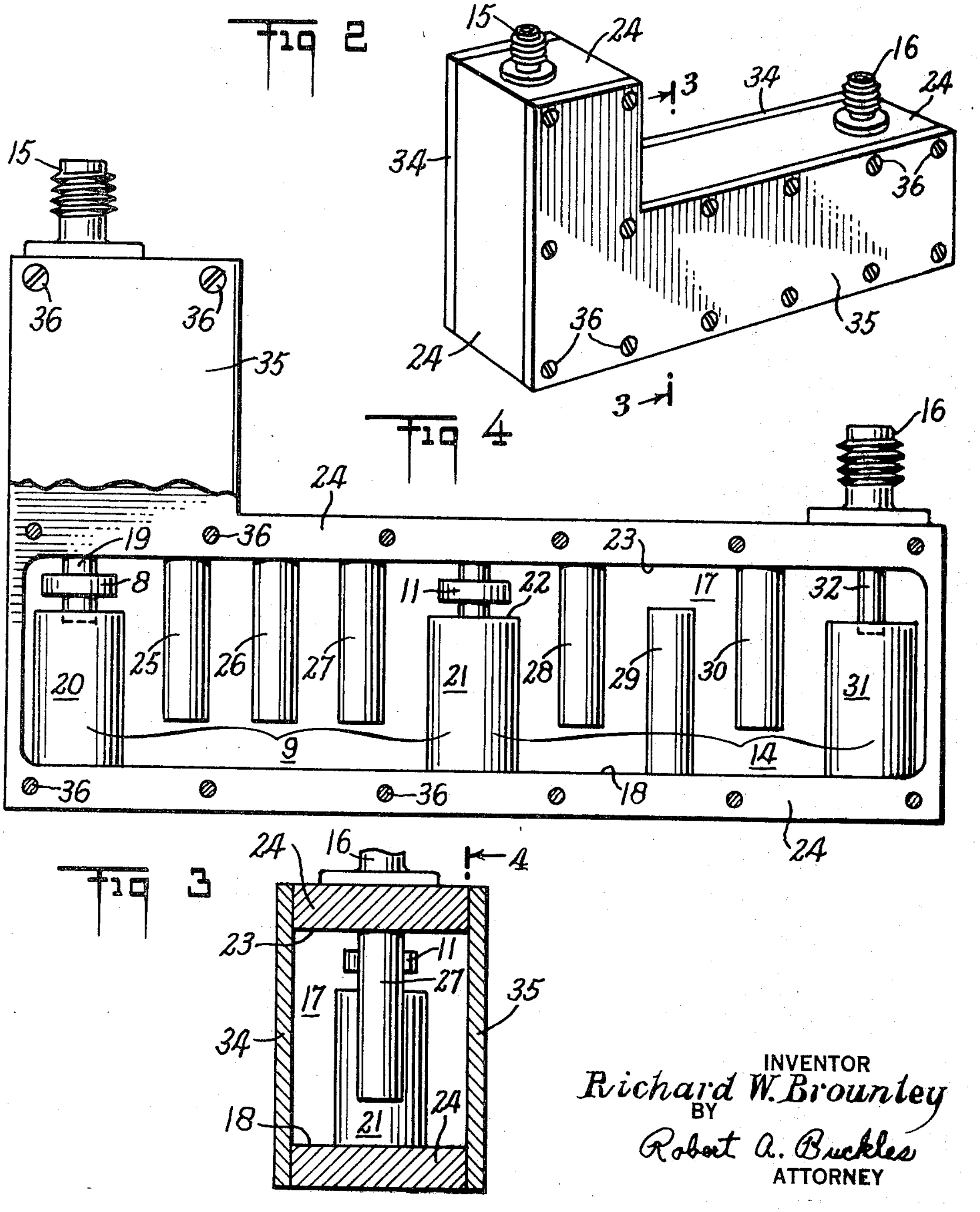
FIG. 2 is a perspective view of the device of the invention.
FIG. 3 is an enlarged partial cross-sectional view of the device (approximately full scale) as taken along the line 3—3 of FIG. 2.
FIG. 4 is a longitudinal cross-sectional view of the device taken along the line 4—4 of FIG. 3.

The simplicity of the structure forming the frequency multiplier of the invention is shown by the sectional views of FIG. 3 and FIG. 4, while the external appearance of the enclosed cavity device is shown by the perspective view of FIG. 2.

Referring now in greater detail to FIG. 4 of the drawing, a substantially rectangular microwave cavity 17 is formed in a solid metallic block 16, preferably a brass casting. The inner cavity wall surface 18 is machined and polished to a smooth finish, and is preferably plated with silver or gold to further reduce skin effect attenuation of microwave energy resonating therein. A coaxial input connector 15 is insulatingly mounted on the external wall 24 at one end of the cavity 17 and connects directly with the input line 13 of the band pass filter section 1 as shown in detail in FIG. 1. The output line 19 of band pass filter 1 connects directly to the first varactor 8 which is mounted within the cavity 17 and secured atop the top surface of a cylindrical inclusive coupling post 20, which in turn is securely mounted on the opposite internal cavity wall 18.

Midway between opposite ends of cavity 17 a second cylindrical inductive post 21 is securely mounted on the inner cavity wall 18 and supports between its upper end surface 22, and the opposite internal surface 23 of cavity wall 24 another non-linear capacitive element 11, preferably a varactor like the element 8. Between inductive posts 20 and 21 a plurality of smaller diameter cylindrical inductive posts 25, 26 and 27 are centrally secured to the inner cavity wall surface 23 and extend downwardly toward, but spaced from, the opposite cavity wall surface 18. These inductive posts 25, 26 and 27 function in the input section of the cavity, in cooperation with input post 20 and varactor post 21, as a combline filter, identified generally by reference numeral 9, permitting the input resonant frequency 4 *f-in* to pass through to the varactor element 11, but effectively preventing energy of any other frequency from passing in the reverse direction. The resonant energy at frequency 4 *f-in* energizes varactor 11, causing it to generate a multitude of parametric oscillations, all of which are harmonics of 4 *f-in*.

Still referring to FIG. 4, the second section of the device, to the right of center post 21 as shown in FIG. 4 of the drawing, comprises a plurality of cylindrical metallic posts, 28, 29, 30 which may be identical to posts 25, 26 and 27 except that they are alternately mounted on opposite facing walls within cavity 17. Thus, posts 28 and 30 are mounted on the top inner wall surface 23, while post 29 is secured to the bottom inner wall surface 18. To the right of post 30 as shown in FIG. 4 a larger diameter cylindrical post 31 is secured to the bottom inner wall surface 18 and extends upwardly to directly couple with an output line 32 which is connected with the central conductor of a coaxial output connector 16. As shown in FIG. 3, all of the inductive posts are centrally positioned within the cavity 17 and are bisected by an imaginary vertical plane passing longitudinally through the center of cavity 17. The central inductive post 21 serves as the output coupling element for the combline filter section 9 (FIG. 4) and also as the input coupling element for the interdigital filter section 14 (FIG. 4), thus the inductance post 21 common to both input and output filter sections efficiently combines the two filter sections into a single compact, unitary device without the substantial losses which would occur if two separate filters were coupled through conventional connectors.

The cavity 17 is enclosed by metallic side plates 34 and 35, as shown in FIG. 2, and FIG 3. Side plates 34 and 35 are secured to the cavity block 24 by means of machine screws 36, as shown in FIG. 2. For maximum efficiency, and to minimize skin effect losses, all internal parts should be smoothly finished with polished surfaces and preferably plated with highly conductive metal such as silver or gold.

By the structure hereinabove disclosed, with all parts fabricated to the proportions shown in FIG. 3 and FIG 4 of the drawing, I have created an efficient broad band microwave frequency multiplier for converting broad band microwave energy of a first input frequency (*f-in*) as applied to input terminal 15 into broad band microwave energy at twelve times the input frequency (12 *f-in*) at the output terminal 16. It is to be understood, however, that the invention is not limited to twelve times frequency multiplication, but that the structure may be modified in size and in number of multiplication sections to accommodate even higher frequency conversions, or in the alternative all parts may be proportionally increased in size for lower frequency longer wave energy conversions; or if desired the output cavity section comprising inductive posts 21, 28, 29, 30 and 31 may be substantially reduced in size to effect tuning of the output resonant section to the third, fifth, or any higher harmonic of the fundamental input frequency, thereby producing frequency multipliers with great flexibility of frequency choices and of orders of multiplication.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention which, as a matter of language, might be said to fall therebetween.

Having described my invention, what I claim as new and desire to secure by Letters Patent is:

1. A broad band microwave frequency multiplier comprising in unitary combination a band pass input filter section substantially tuned to pass a first fundamental frequency band of electromagnetic energy, a first non-linear variable capacitive element within a tuned resonant cavity and directly coupled to said input filter section whereby said element is adapted to be energized by said fundamental frequency energy and when so energized to produce parametric oscillations at higher frequencies which are harmonic multiples of said fundamental frequency, a combline filter section within said tuned resonant cavity having an input coupling post supporting said first non-linear variable capacitive element, said combline filter section being tuned to pass only a selected harmonic of said fundamental frequency energy and to reject all other frequencies, a second non-linear variable capacitive element within said cavity and supported by an output coupling post of said combline filter whereby said second element is energized by said selected harmonic energy passed by said combline filter section, said second non-linear element when so energized producing parametric oscillations at still higher frequencies which are further harmonic multiples of said selected harmonics, and an interdigital output filter section within said cavity employing said combline output coupling post as its input coupling element and substantially tuned to pass on a selected harmonic of said further harmonic frequency generated by said second non-linear element and to reject all other frequencies.

2. A microwave radio frequency multiplier comprising as a unitary structure, a substantially rectangular elongated hollow metallic cavity having a first substantially solid metallic inductive input post within said cavity at one end thereof, said first inductive post affixed to a first inner wall of said cavity and extending toward an opposite wall thereof but spaced therefrom, a second substantially solid metallic inductive output post within said cavity at the opposite end thereof and affixed to said first inner cavity wall and extending toward but spaced from the opposite inner wall, a third centrally fixed substantially solid metallic inductive post within said cavity affixed to said first wall thereof and extending inwardly within said cavity midway between said input and output inductive posts toward the opposite wall thereof but spaced therefrom, a first non-linear variable capacitive element within said cavity mounted on the extending end of said first metallic inductive post and directly connected to a fundamental frequency input line extending through said opposite cavity wall, a second non-linear variable capacitive element connected between the extending end of said central inductive post and said opposite cavity wall, a first plurality of metallic inductive posts mounted on said opposite wall in a common plane within said cavity spaced between said input inductive post and said centrally fixed inductive post and forming therebetween an effective band pass combline filter section, a second plurality of metallic inductive posts alternately mounted on said opposed walls within said cavity and extending in the same common plane as said first inductive posts between said centrally fixed inductive post and said output inductive post and forming therebetween an effective interdigital band pass filter section, and an output conductor directly connected to said output inductive post and insulatingly extending through said cavity wall to an external output connector.

3. The structure of claim 2 wherein said first substantially solid cylindrical metallic inductive tuning post mounted within said cavity extends from said first wall thereof toward but spaced from the opposite internal wall of said cavity and supports said first non-linear capacitive element on its extending end in the space between said supporting end and said wall, and an input probe directly connecting said first non-linear element to a band pass filter section outside said cavity.

References Cited

UNITED STATES PATENTS

| | | | |
|---|---|---|---|
| 3,263,154 | 7/1966 | Steele | 321—69 |
| 3,311,812 | 3/1967 | Geiszler et al. | 321—69 |
| 3,381,207 | 4/1968 | Guthrie | 321—69 |
| 3,443,199 | 5/1969 | Collins et al. | 321—69 |

J D MILLER, Primary Examiner

G. GOLDBERG, Assistant Examiner